(12) United States Patent
Ibane

(10) Patent No.: US 7,982,485 B2
(45) Date of Patent: Jul. 19, 2011

(54) SEMICONDUCTOR TEST DEVICE CAPABLE OF MODIFYING AN AMPLITUDE OF AN OUTPUT SIGNAL OF A DRIVER

(75) Inventor: Toru Ibane, Tokyo (JP)

(73) Assignee: Advantest Corporation, Tokyo (JP)

( * ) Notice: Subject to any disclaimer, the term of this patent is extended or adjusted under 35 U.S.C. 154(b) by 131 days.

(21) Appl. No.: 12/443,176

(22) PCT Filed: Sep. 25, 2007

(86) PCT No.: PCT/JP2007/068530
§ 371 (c)(1),
(2), (4) Date: Mar. 26, 2009

(87) PCT Pub. No.: WO2008/044464
PCT Pub. Date: Apr. 17, 2008

(65) Prior Publication Data
US 2010/0001754 A1    Jan. 7, 2010

(30) Foreign Application Priority Data
Oct. 10, 2006    (JP) .................................. 2006-276067

(51) Int. Cl.
G01R 31/02    (2006.01)
G01R 31/26    (2006.01)

(52) U.S. Cl. .................................................. 324/762.01

(58) Field of Classification Search .................. None
See application file for complete search history.

(56) References Cited

U.S. PATENT DOCUMENTS
6,479,983 B1 * 11/2002 Ebiya ........................ 324/158.1

FOREIGN PATENT DOCUMENTS
| JP | 11-38087 A | 2/1999 |
| JP | 11-337627 A | 12/1999 |
| JP | 2004-020408 A | 1/2004 |

* cited by examiner

Primary Examiner — Roberto Velez
(74) Attorney, Agent, or Firm — patenttm.us

(57) ABSTRACT

It is possible to provide a semiconductor test device capable improving the test efficiency. The semiconductor test device includes: a driver (14) which generates a driver signal outputted to a device under test; a variable delay circuit (12) provided at the preceding stage of the driver (14); a register (16) for setting an output level of a driver signal outputted from the driver (14); a correction value memory (26) which outputs correction data corresponding to a shift of the rise timing or the fall timing of the driver signal when the output level is modified from a predetermined value serving as a reference value of the output level; an amplitude correction value register (28) which sets a delay amount by a variable delay circuit (12) by considering correction data which is outputted from the correction value memory (26); an adder circuit (30).

6 Claims, 4 Drawing Sheets

SEMICONDUCTOR TEST DEVICE CAPABLE OF MODIFYING AN AMPLITUDE OF AN OUTPUT SIGNAL OF A DRIVER

TECHNICAL FIELD

The present invention relates to a semiconductor test device capable of modifying an amplitude of an output signal of a driver.

BACKGROUND ART

A pin electronics of a semiconductor test device includes a driver applying a signal to a device under test. The driver performs an output operation of a signal in synchronization with a clock signal to be inputted. Since a time length of a signal path at each input/output pin in the device under test varies, timing for outputting a signal from each driver is shifted from expected timing in an initial state. Because of this, timing calibration is preformed before performing various tests to the device under test (for example, see Patent Document 1).

FIG. 3 is a diagram showing a configuration of a conventional semiconductor test device capable of modifying an output level (amplitude) of a driver. FIG. 4 is a flowchart showing an operation procedure of timing calibration performed with the configuration shown in FIG. 3. Initially, calibration is performed in an arbitrary fixed condition (time length data showing rise timing of a clock signal in the fixed condition is stored in a clock timing register 110, and level data specifying the output level of the driver is stored in a level register 102) (step 200). Various conventionally known methods can be used as a specific method for the calibration. For example, a case can be considered such as input timing of a strobe signal regulates rise timing of a clock signal outputted from a driver 100 by using a known reference comparator. Thus, timing calibration up to an output terminal A of the test device is performed when an output level of the clock signal outputted from the driver 100 has a certain value. Time-length data as a result of the calibration is stored in a calibration register 112.

Next, a device test condition to be actually performed is set (step 201). Level data of a clock signal to be inputted to a device under test is stored in the level register 102 at setting of the test condition. When the level data of the clock signal is modified, the timing calibration is required each time, and then, calibration is performed based on the test condition (step 202). Time length data newly obtained by the calibration is stored in the calibration register 112.

FIGS. 5 and 6 are explanatory diagrams of the calibration operation according to a level modification. When two kinds of clock signals with a high level and a low level are considered, time necessary for a high-level clock signal to rise is Ta and time necessary for a low-level clock signal to rise is Tb, as shown in FIG. 5. If a high/low detection of the clock signal is performed with 50% of a voltage of an amplitude in the clock signal as a threshold value, the high-level clock signal changes from low level to high level at a time Ty (=Ta/2) after starting rising, while the low-level clock signal changes from low level to high level at a time Tx (=Tb/2) after starting rising. Since Ty>Tx, timing from low level to high level varies only by changing an amplitude level of the clock signal so that timing calibration for regulating this variation is required. Specifically, as shown in FIG. 6, timing that amplitudes of the respective clock signals become 50% is made identical by delaying timing for starting rising of the low-level clock signal (or timing for starting rising of the high-level clock signal may be contrarily increased). After the calibration corresponding to an actual test condition is performed in this manner, a function test or the like (device measurement) to a device under test is performed (step 203). In the case where the device measurement is performed N times with the test condition changed, the operations in steps 201 to 203 are repeated N times. Patent Document 1: Japanese Patent Laid-Open No. 2004-20408 (pp. 2-4, FIGS. 17 to 22)

DISCLOSURE OF THE INVENTION

Problems to be Solved by the Invention

The conventional method for calibration according to the operation procedure shown in FIG. 4 requires calibration every time a test condition (an amplitude level of a clock signal in particular) is changed. Because of this, time from setting a test condition to completing a device measurement becomes longer, which causes a problem of reducing overall throughput (test efficiency) of the test. The conventional method disclosed in Patent Document 1 does not require calibration at the time of modifying an amplitude of the clock signal by constantly maintaining rise time of the clock signal outputted from the driver not depending on an amplitude. However, each driver requires a peripheral circuit therefor and a device size increases.

In light of the above-mentioned circumstances, an object of the present invention is to provide a semiconductor test device capable of improving test efficiency.

Means for Solving the Problems

In order to solve the problems, a semiconductor test device of the present invention includes: a driver which generates a driver signal outputted to a device under test; a delay unit provided at a preceding stage of the driver and variably delaying output timing of the driver signal outputted from the driver; a level setting unit for setting an output level of the driver signal outputted from the driver; a correction data output unit which outputs correction data corresponding to a shift of rise timing or fall timing of the driver signal when the output level is modified from a predetermined value serving as a reference value of the output level; and a delay amount setting unit which sets a delay amount by the delay unit by considering the correction data outputted from the correction data output unit. Since the correction data depending on the output level of the driver is outputted for setting the delay amount of the driver signal, timing calibration is not necessary every time the output level of the driver is modified. As a result, test efficiency (throughput) can be improved in the case of performing a plurality of tests with a test condition changed.

The delay amount set by the delay amount setting unit includes a component corresponding to the correction data and a component corresponding to a factor other than the correction data. It is desirable that the delay amount setting unit set the corresponding delay amount when a test condition is modified. Because of this, when contents of the correction data are modified depending on the output level of the driver, a delay amount can be set considering the modified contents.

Additionally, the delay amount setting unit includes a first register for storing the correction data, a second register for storing data corresponding to the factor other than the correction data, and an adder circuit which adds the data respectively stored in the first and second registers. It is desirable that the delay unit set a delay amount by using the data added by the adder circuit. Because of this, the modification of the correction data can be certainly reflected to setting contents of the delay amount.

The correction data output unit is a correction value memory which stores the correction data corresponding to the output level of the driver set by the level setting unit. It is desirable that the correction data corresponding to the output level be outputted when the output level is inputted. Because of this, when the output level is modified according to modification of a test condition, correction data corresponding to the output level can be obtained without a complicated process.

The correction value memory also stores a table showing a relation between a set value of the output level of the driver and the correction data. It is desirable that the correction value memory output the corresponding correction data based on the table when the set value of the output level of the driver is inputted.

It is also desirable that the correction data output unit be a correction data operation section which operates the correction data corresponding to the output level of the driver set by the level setting unit.

Figure 1:
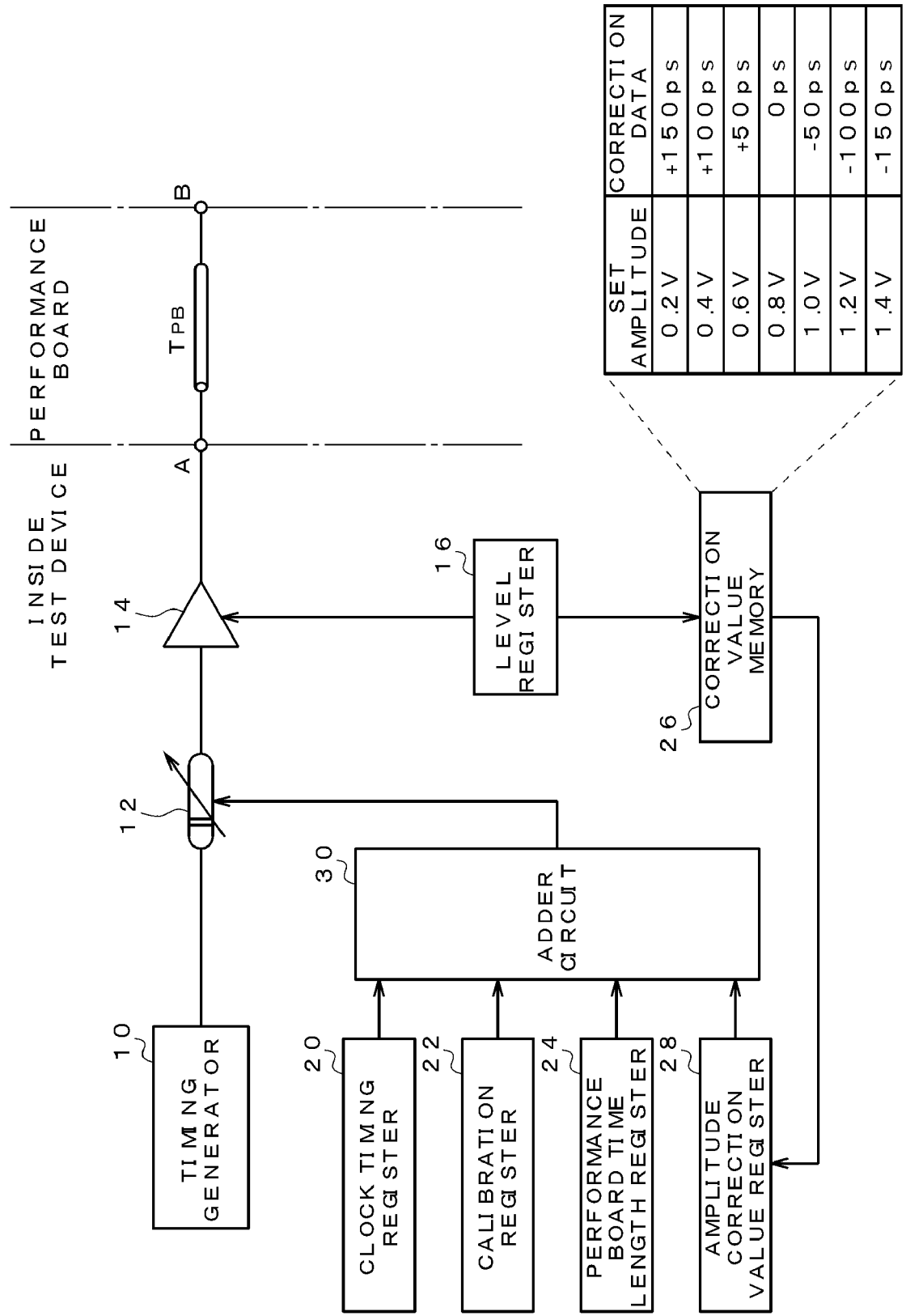
FIG. 1 is a diagram showing a partial configuration of a semiconductor test device that is an object of timing calibration preformed in an embodiment.

DESCRIPTION OF SYMBOLS 10 timing generator
12 variable delay circuit
14 driver
16 level register
20 clock timing register
22 calibration register
24 performance board time length register
28 amplitude correction value register
26 correction value memory
30 adder circuit

BEST MODE FOR CARRYING OUT THE INVENTION

Hereinafter, described in detail is a semiconductor test device of an embodiment to which the present invention is applied. FIG. 1 is a diagram showing a partial configuration of the semiconductor test device that is an object of timing calibration preformed in the embodiment. FIG. 1 shows a configuration of an inside of the test device having a performance board connected, and corresponding to an output terminal A. The semiconductor test device has the configuration shown in FIG. 1 corresponding to each of a plurality of the output terminals A.

As shown in FIG. 1, the inside of the semiconductor test device in the embodiment has a timing generator 10, a variable delay circuit 12, a driver 14, a level register 16, a clock timing register 20, a calibration register 22, a performance board time length register 24, a correction value memory 26, an amplitude correction value register 28, and an adder circuit 30.

The timing generator 10 generates a signal rising (or falling) in a predetermined basic period. The variable delay circuit 12 delays the signal outputted from the timing generator 10 for a predetermined set time to output it. An output value of the adder circuit 30 is used as the set time to be set. The driver 14 performs waveform shaping to the signal inputted from the variable delay circuit 12 to output a clock signal in phase with the input signal and having a predetermined output level (amplitude). The clock signal outputted from the driver 14 is also called a driver signal.

The level register 16 stores a set value of an output level of the driver 14. The driver 14 generates and outputs a clock signal with an output level corresponding to the set value stored in the level register 16.

The clock timing register 20 stores a set value specifying timing that the clock signal rises (or falls) in the basic period. The set value is a design value with a shift of a time length due to wiring or the like not considered, and is shown by time from start timing of the basic period (or a value equal thereto).

The calibration register 22 stores a correction value for time length variation up to the output terminal A inside of the test device. The correction value can be obtained by timing calibration. Various conventionally known methods can be used as a specific method for the timing calibration.

The performance board time length register 24 stores a time length $T_{PB}$ of wiring in the performance board, that is, the time length $T_{PB}$ of the wiring from the output terminal A of the semiconductor test device to an end B of the performance board. For example, a performance board to be used stores a known time length $T_{PB}$ (a calculated value based on design information or a value obtained by measuring a time length of wiring actually used may be used). Each pin of a device under test is connected to the end B of the performance board directly or through another member such as a socket board.

The correction value memory 26 stores a table showing a relation between a set value of the output level of the clock signal outputted from the driver 14 and correction data. For example, as shown in FIG. 1, the correction value memory 26 stores a table showing correction data of +150 ps, +100 ps, +50 ps, −50 ps, −100 ps, −150 ps corresponding to respective set amplitudes of 0.2 V, 0.4 V, 0.6 V, 1.0 V, 1.2 V, 1.4 V with reference to 0.8 V of the set value (set amplitude) of the output level in the clock signal (the correction data is 0 ps). When an address showing the value of the set amplitude is inputted, the correction value memory 26 outputs the corresponding correction data stored in the address. The correction data outputted from the correction value memory 26 is stored in the amplitude correction value register 28.

The adder circuit 30 adds data (various set values, correction values, or the like) respectively stored in the clock timing register 20, the calibration register 22, the performance board time length register 24, and the amplitude correction value register 28 to output it. As described above, the output value of the adder circuit 30 is a value corresponding to the output level of the driver 14.

The variable delay circuit 12 corresponds to the delay unit; the level register 16 corresponds to the level setting unit; the correction value memory 26 corresponds to the correction data output unit; and the clock timing register 20, the calibration register 22, the performance board time length register 24, the amplitude correction value register 28 and the adder circuit 30 correspond to the delay amount setting unit. Additionally, the amplitude correction value register 28 corresponds to the first register storing the correction data, while the clock timing register 20, the calibration register 22 and the performance board time length register 24 correspond to the second register storing data corresponding to a factor other than the correction data.

Figure 2:
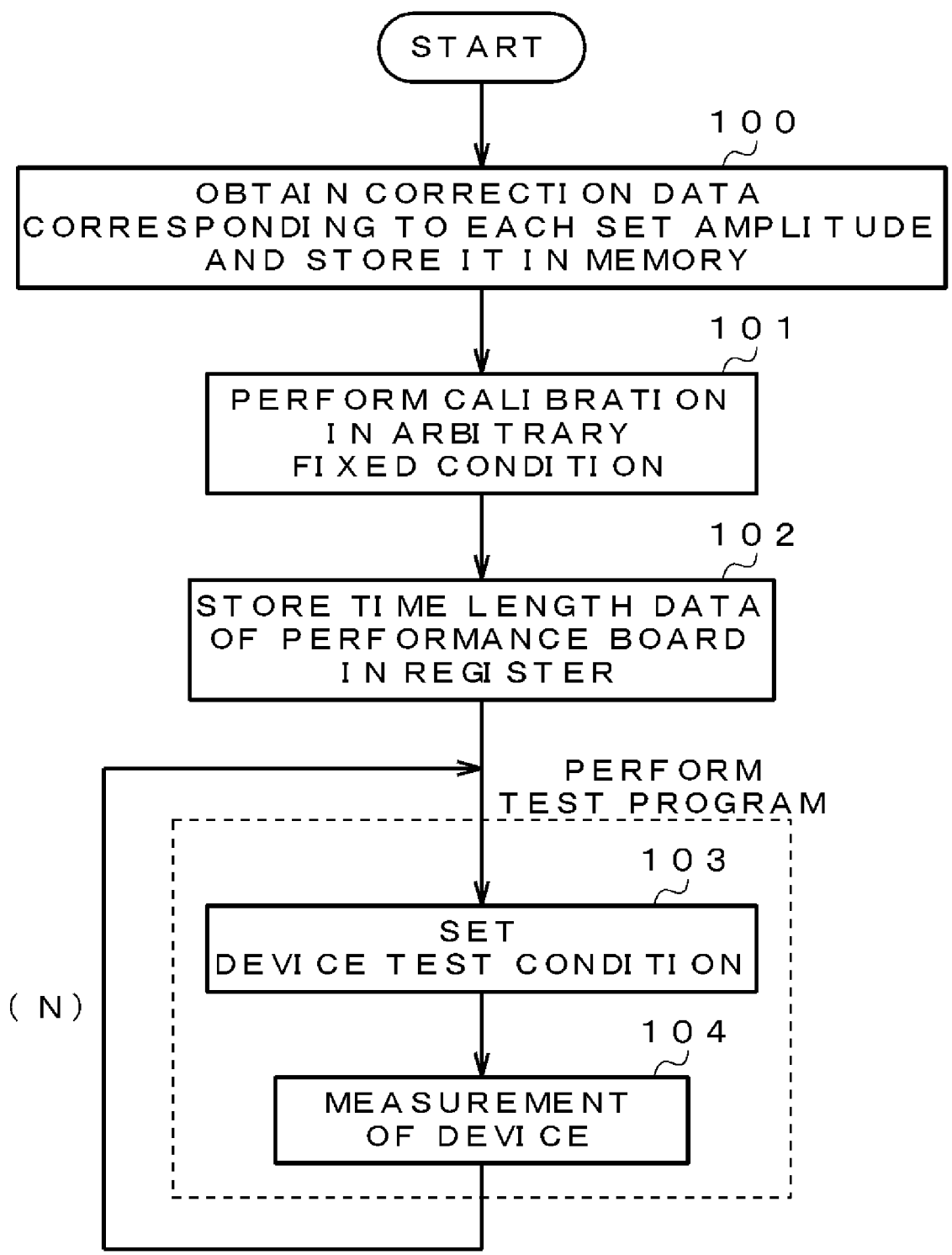
FIG. 2 is a flowchart showing an operation procedure of the timing calibration performed in the semiconductor test device of the embodiment.
Figure 3:
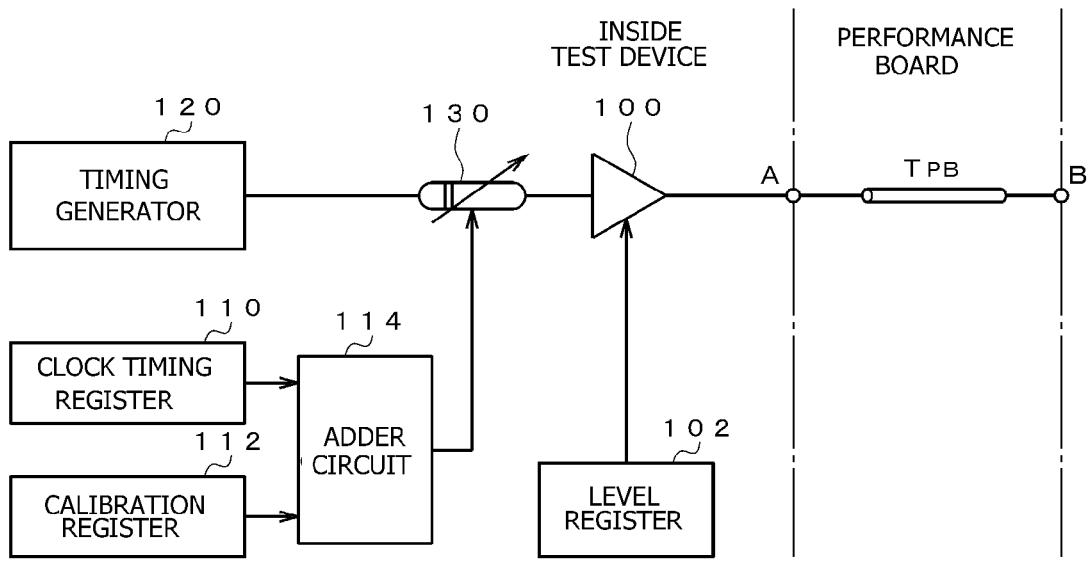
FIG. 3 is a diagram showing a configuration of a conventional semiconductor test device capable of modifying an output level of a driver.
Figure 4:
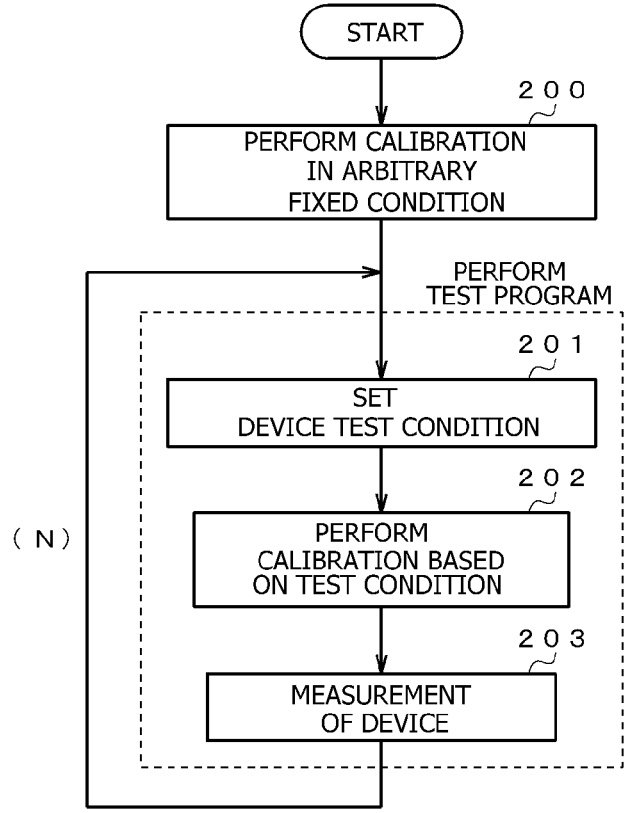
FIG. 4 is a flowchart showing an operation procedure of timing calibration performed with the configuration shown in FIG. 3.
Figure 5:
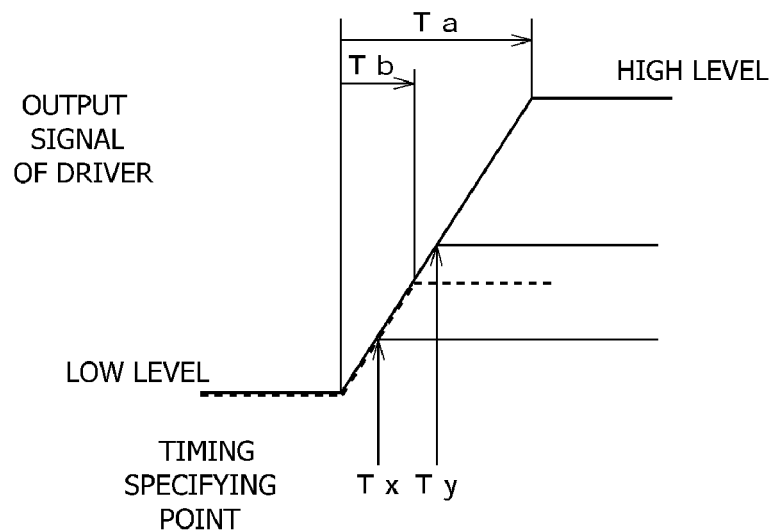
FIG. 5 is an explanatory diagram of a calibration operation according to a level modification.
Figure 6:
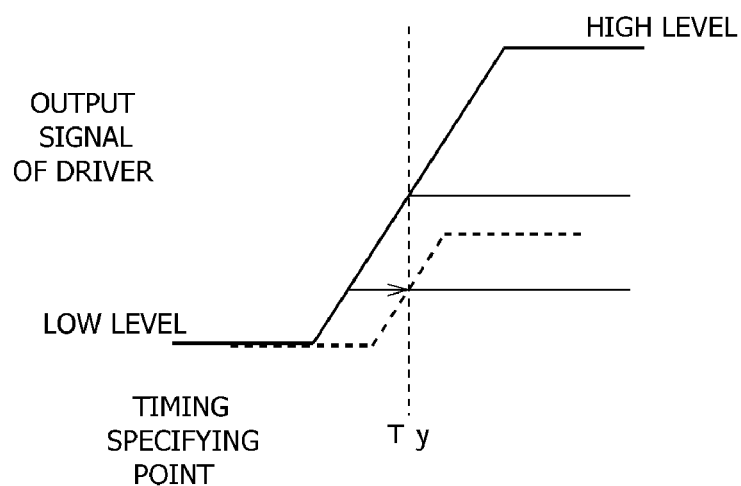
FIG. 6 is an explanatory diagram of the calibration operation according to the level modification.

The semiconductor test device of the embodiment has a configuration like this. Next, an operation is described in the case of performing timing calibration every time a test condition is modified. FIG. 2 is a flowchart showing an operation procedure of the timing calibration performed in the semiconductor test device of the embodiment. Before a test operation, correction data corresponding to each predetermined amplitude (set value of an output level in a clock signal) is obtained and stored in the correction value memory 26 (step 100). This storing operation is performed only once at the time of starting the test and omitted at the time of a test thereafter. Additionally, the storing operation is not necessarily performed at the time of starting the test, while it may be performed at the time of production, inspection, shipment, carrying-in, or the like of the semiconductor test device.

Next, calibration up to the output terminal A of the semiconductor test device is performed in an arbitrary fixed condition (step 101). The clock timing register 20 previously stores a predetermined set value corresponding to the fixed condition at the time of the calibration in this fixed condition. When a set value of an output level in the fixed condition is stored in the level register 16, correction data corresponding to the output level (set amplitude) is outputted from the correction value memory 26 and stored in the amplitude correction value register 28. The performance board is removed at this calibration, and a time length $T_{PB}$ of wiring stored in the performance board time length register 24 is set at 0. A time length $T_{PB}$ of actual wiring is stored in the performance board time length register 24 after the calibration is completed (step 102).

Next, a device test condition corresponding to test contents to be actually performed is set (step 103). A set value corresponding to the test condition is stored in the clock timing register 20 at the setting of the test condition. Additionally, correction data corresponding to an output level (set amplitude) included in the test condition is outputted from the correction value memory 26 and stored in the amplitude correction value register 28. After the respective settings of the clock timing register 20 and the amplitude correction value register 28 are completed in this manner, a function test or the like (device measurement) is preformed to the device under test (step 104). In the case where the device measurement is performed N times with the test condition changed, the operations in steps 103 and 104 are repeated N times.

As described above, since the correction data depending on the output level of the driver 14 is outputted for setting the delay amount of the driver signal in the semiconductor test device of the embodiment, timing calibration is not necessary every time the output level of the driver 14 is modified. As a result, test efficiency (throughput) can be improved in the case of performing a plurality of tests with a test condition changed.

Additionally, when the output level is modified according to modification of the test condition, correction data corresponding to the output level can be obtained without a complicated process by providing the correction value memory 26 storing the correction data corresponding to the output level of the driver 14.

The present invention is not limited to the embodiment described above and various modifications can be made within the gist of the scope of the present invention. In the embodiment, the correction value memory 26 stores a table to be stored for obtaining the correction data corresponding to the set value (set amplitude) of the output level set by the level register 16, while the correction data may be obtained by a method other than that. For example, in the example shown in FIG. 1, a relation between the set amplitude and the correction data can be expressed by a linear equation, and therefore, a slope and an intercept values identifying the linear equation are set and correction data corresponding to an inputted set amplitude may be obtained by an operation with using these set values. In this case, the correction value memory 26 may be replaced with a correction data operation section for performing this operation.

INDUSTRIAL APPLICABILITY

According to the present invention, the correction data depending on the output level of the driver is outputted for setting the delay amount of the driver signal, and therefore, timing calibration is not necessary every time the output level of the driver is modified. As a result, test efficiency (throughput) can be improved in the case of performing a plurality of tests with a test condition changed.

The invention claimed is:

1. A semiconductor test device comprising:
   a driver which generates a driver signal outputted to a device under test;
   a delay unit provided at a preceding stage of the driver and variably delaying output timing of the driver signal outputted from the driver;
   a level setting unit for setting an output level of the driver signal outputted from the driver;
   a correction data output unit which outputs correction data corresponding to a shift of rise timing or fall timing of the driver signal when the output level is modified from a predetermined value serving as a reference value of the output level; and
   a delay amount setting unit which sets a delay amount by the delay unit by considering the correction data outputted from the correction data output unit.

2. A semiconductor test device comprising:
   a driver which generates a driver signal outputted to a device under test;
   a delay unit provided at a preceding stage of the driver and variably delaying output timing of the driver signal outputted from the driver;
   a level setting unit for setting an output level of the driver signal outputted from the driver;
   a correction data output unit which outputs correction data corresponding to a shift of rise timing or fall timing of the driver signal when the output level is modified from a predetermined value serving as a reference value of the output level; and
   a delay amount setting unit which sets a delay amount by the delay unit by considering the correction data outputted from the correction data output unit,
   wherein the delay amount set by the delay amount setting unit includes a component corresponding to the correction data and a component corresponding to a factor other than the correction data, and the delay amount setting unit sets the corresponding delay amount when a test condition is modified.

3. The semiconductor test device according to claim 2, wherein the delay amount setting unit includes a first register for storing the correction data, a second register for storing data corresponding to the factor other than the correction data, and an adder circuit which adds the data respectively stored in the first and second registers; and the delay unit sets a delay amount by using the data added by the adder circuit.

4. The semiconductor test device according to claim 3, wherein the correction data output unit is a correction value memory which stores the correction data corresponding to the output level of the driver set by the level setting unit, and outputs the correction data corresponding to the output level when the output level is inputted.

5. The semiconductor test device according to claim 4, wherein the correction value memory stores a table showing a relation between a set value of the output level of the driver and the correction data, and outputs the corresponding correction data based on the table when the set value of the output level of the driver is inputted.

6. The semiconductor test device according to claim 3, wherein the correction data output unit is a correction data operation section for operating the correction data corresponding to the output level of the driver set by the level setting unit.

\* \* \* \* \*